(12) United States Patent
Tang et al.

(10) Patent No.: US 10,143,112 B2
(45) Date of Patent: Nov. 27, 2018

(54) MACHINE CABINET FOR DISSIPATING HEAT

(71) Applicant: BEIJING BAIDU NETCOM SCIENCE AND TECHNOLOGY CO., LTD., Beijing (CN)

(72) Inventors: Hu Tang, Beijing (CN); Xianguang Tan, Beijing (CN); Tianyu Zhou, Beijing (CN); Ruiquan Ding, Beijing (CN); Binghua Zhang, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 73 days.

(21) Appl. No.: 15/279,221

(22) Filed: Sep. 28, 2016

(65) Prior Publication Data
US 2017/0359919 A1    Dec. 14, 2017

(30) Foreign Application Priority Data
Jun. 14, 2016 (CN) .......................... 2016 1 0416652

(51) Int. Cl.
*F28F 7/00* (2006.01)
*H05K 7/20* (2006.01)
*H01L 23/427* (2006.01)

(52) U.S. Cl.
CPC ......... *H05K 7/208* (2013.01); *H05K 7/20336* (2013.01); *H05K 7/20818* (2013.01); *H01L 23/427* (2013.01)

(58) Field of Classification Search
CPC ........... H05K 7/20336; H05K 7/20818; H05K 7/208; H01L 23/427

(Continued)

(56) References Cited

U.S. PATENT DOCUMENTS 7,885,074 B2 * 2/2011 Campbell ............. H01L 23/427
165/104.33
8,322,154 B2 * 12/2012 Campbell ........... F28D 15/0266
165/104.21

(Continued)

FOREIGN PATENT DOCUMENTS

| CN | 1805133 A | 1/2005 |
| CN | 103298312 A | 9/2013 |
| CN | 104320953 A | 1/2015 |

*Primary Examiner* — Len Tran
*Assistant Examiner* — Paul Alvare
(74) *Attorney, Agent, or Firm* — Seed IP Law Group LLP (57) ABSTRACT

The machine cabinet for dissipating heat includes a housing, and an inner chamber, a liquid working medium accommodating area, a heat exchanger and a delivery passage disposed in the housing. The inner chamber is in a vacuum state and accommodates electronic devices to be cooled; the liquid working medium accommodating area accommodates a liquid working medium, the liquid working medium is converted into a gas working medium to enter the heat exchanger after cooling the electronic devices to be cooled; the heat exchanger liquefies the gas working medium into a liquid working medium and guides the liquid working medium obtained by liquefying the gas working medium into the delivery passage; and the delivery passage is connected with the heat exchanger and the liquid working medium accommodating area and guides the liquid working medium obtained by liquefying the gas working medium into the liquid working medium accommodating area.

6 Claims, 5 Drawing Sheets

(58) Field of Classification Search
USPC .............................................. 165/80.2, 80.4
See application file for complete search history.

(56) References Cited

U.S. PATENT DOCUMENTS

| | | | | |
|---|---|---|---|---|
| 8,490,679 B2* | 7/2013 | Campbell | ................ | F28D 15/02 |
| | | | | 165/104.21 |
| 8,934,245 B2* | 1/2015 | Yoshikawa | ............ | H01L 23/427 |
| | | | | 165/104.33 |
| 8,941,994 B2* | 1/2015 | Campbell | ................ | B23P 15/26 |
| | | | | 165/166 |
| 2009/0133866 A1* | 5/2009 | Campbell | ................ | G06F 1/20 |
| | | | | 165/288 |
| 2012/0268877 A1* | 10/2012 | Rice | ........................ | F25B 21/02 |
| | | | | 361/679.4 |
| 2013/0128461 A1* | 5/2013 | Nagasawa | ................ | G06F 1/20 |
| | | | | 361/704 |
| 2014/0071626 A1* | 3/2014 | Campbell | ................ | B23P 15/26 |
| | | | | 361/700 |

\* cited by examiner

MACHINE CABINET FOR DISSIPATING HEAT

CROSS-REFERENCE TO RELATED APPLICATION

This application is related to and claims priority from Chinese Application No. 201610416652.2, filed on Jun. 14, 2016, entitled "MACHINE CABINET," the entire disclosure of which is hereby incorporated by reference.

TECHNICAL FIELD

The present application relates to the field of hardware device technology, specifically to the field of heat dissipating hardware technology, and in particular to a machine cabinet for dissipating heat.

BACKGROUND

With the deepening of informatization and the development of various industries such as the mobile Internet industry and the logistics industry, more and more devices are connected to networks. As a result, the transmitted data amount increases greatly, leading to the vast needs of developing networks and establishing data centers. Therefore, more and more electronic devices such as servers, routers and switches are needed to process the data.

Figure 1A:
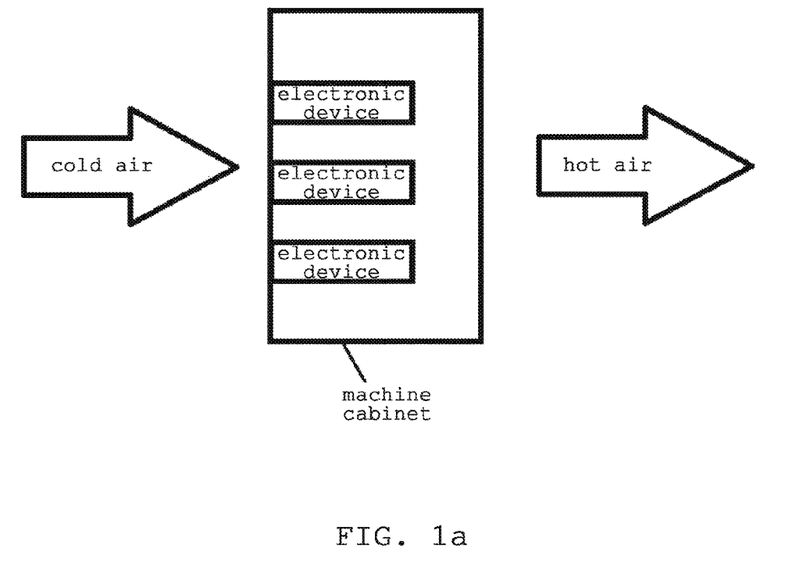
FIG. 1a is a schematic diagram of a first traditional cooling solution.
Figure 1B:
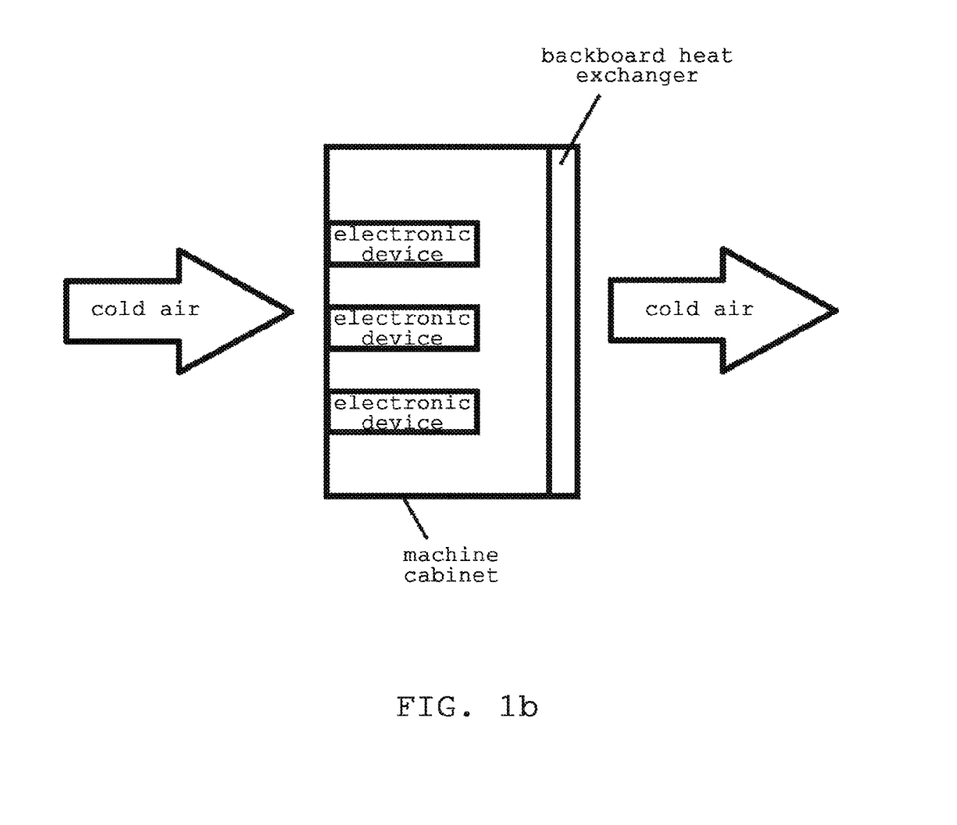
FIG. 1b is a schematic diagram of a second traditional cooling solution.

However, for the existing device heat dissipating technology used in a data center, as referred in the first traditional cooling solution illustrated in FIG. 1a, the first traditional cooling solution implements the cooling of a server through air convection, whereby a terminal air conditioner (an apparatus converting hot air into cold air) may be located at different locations such as a corner of the room, next to the machine cabinet, on top or at the bottom of the machine cabinet. For reference, a second traditional cooling solution is illustrated in FIG. 1b, the second traditional cooling solution uses a backboard heat exchanger to perform staged backboard air cooling. Staged backboard air cooling is effective in saving energy, but still causes air circulation. Air circulation may cause problems in controlling humidity and cleanness (dusts and harmful gases). Even if the current servers are increasingly tolerant to these problems, these factors still constrain the service life of the electronic devices, namely, they lower the service life of electronic devices.

SUMMARY

One of the purposes of the present application is to provide an improved machine cabinet to solve the technical problem mentioned in the background.

The present application provides a machine cabinet, comprising a housing, and an inner chamber, a liquid working medium accommodating area, a heat exchanger and a delivery passage disposed in the housing, wherein the inner chamber is in a vacuum state and configured to accommodate electronic devices to be cooled; the liquid working medium accommodating area is configured to accommodate a liquid working medium, the liquid working medium is converted into a gas working medium to enter the heat exchanger after cooling the electronic devices to be cooled; the heat exchanger is configured to liquefy the gas working medium into a liquid working medium and guide the liquid working medium obtained by liquefying the gas working medium into the delivery passage; and the delivery passage is connected with the heat exchanger and the liquid working medium accommodating area and is configured to guide the liquid working medium obtained by liquefying the gas working medium into the liquid working medium accommodating area.

In some embodiments, the housing comprises a side wall, a bottom and a top, the liquid working medium accommodating area is located between the bottom and the inner chamber; the heat exchanger is located between the inner chamber and the top; and the delivery passage is located between the inner chamber and the side wall.

In some embodiments, a delivery pump is provided in the delivery passage, and configured to accelerate the guiding of the liquid working medium obtained by liquefying the gas working medium into the liquid working medium accommodating area.

In some embodiments, the machine cabinet further comprises a machine cabinet temperature adjusting device, wherein the machine cabinet temperature adjusting device comprises a coolant adjusting device configured to adjust temperature of a coolant entering the heat exchanger.

In some embodiments, the machine cabinet temperature adjusting device further comprises a filling amount adjusting device configured to adjust a filling amount of the liquid working medium filled into the machine cabinet.

In some embodiments, the machine cabinet temperature adjusting device further comprises a sensor arranged in the housing and configured to monitor a parameter in the machine cabinet and send the parameter to the machine cabinet temperature adjusting device, such that the machine cabinet temperature adjusting device controls and adjusts the temperature of the coolant and the filling amount of the liquid working medium based on the parameter.

In some embodiments, the heat exchanger comprises heat exchange tubes and cooling fins arranged below the heat exchange tubes and communicated with the delivery passage, the heat exchange tubes are configured to accommodate a coolant; and the cooling fins are configured to liquefy the gas working medium, collect the liquid working medium obtained by liquefying the gas working medium, and guide the liquid working medium into the delivery passage.

In some embodiments, the machine cabinet further comprises guiding fins arranged below lowest cooling fins and configured to collect the liquid working medium obtained by liquefying with the cooing fins and guide the liquid working medium into the delivery passage.

In some embodiments, cross sections of the cooling fins and the guiding fins are V-shaped.

In some embodiments, two ends of each guiding fin are communicated with the delivery passage, and two ends of each guiding fin are lower than a middle of the guiding fin.

The machine cabinet provided in the present application comprises a housing, and an inner chamber, a liquid working medium accommodating area, a heat exchanger and a delivery passage disposed in the housing, wherein the inner chamber is in a vacuum state and configured to accommodate electronic devices to be cooled; the liquid working medium accommodating area is configured to accommodate a liquid working medium, the liquid working medium is converted into a gas working medium to enter the heat exchanger after cooling the electronic devices to be cooled; the heat exchanger is configured to liquefy the gas working medium into a liquid working medium and guide the liquid working medium obtained by liquefying the gas working medium into the delivery passage; and the delivery passage is connected with the heat exchanger and the liquid working medium accommodating area and is configured to guide the liquid working medium obtained by liquefying the gas working medium into the liquid working medium accommodating area. Thus, a heat dissipating manner with cooling by only the liquid in the machine cabinet can be achieved, the influence of the temperature, humidity, cleanness (dusts and harmful gases) and the like to the electronic devices due to the air circulation can be eliminated, and the service life of the electronic devices can be lengthened.

BRIEF DESCRIPTION OF THE DRAWINGS

After reading detailed descriptions of non-limiting embodiments with reference to the following accompanying drawings, other features, objectives and advantages of the present application will be more apparent.

DETAILED DESCRIPTION OF EMBODIMENTS

The present application is further described in detail through the accompanying drawing and the embodiment. It should be understood that, the specific embodiments described herein are merely used to explain the relevant invention, and are not intended to limit the present invention. In addition, it should be further noted that, in order to facilitate the description, merely the parts related to the relevant invention are shown in the accompanying drawings.

The present application will be described below in detail with reference to the drawings in combination with the embodiments.

Figure 2:
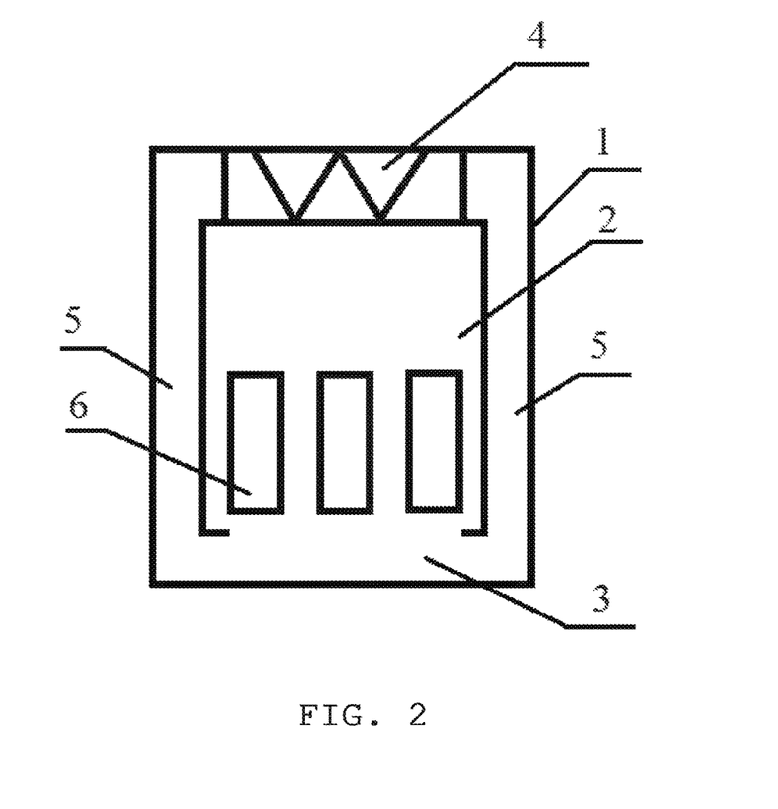
FIG. 2 is a schematic diagram of the machine cabinet according to one embodiment of the present application.

Referring to FIG. 2, a structural schematic diagram of a machine cabinet according to the present application is illustrated.

As illustrated in FIG. 2, the present application discloses a machine cabinet comprising a housing 1, and an inner chamber 2, a liquid working medium accommodating area 3, a heat exchanger 4 and a delivery passage 5 disposed in the housing 1.

Here, the housing 1 may be closed to ensure the vacuum state of the inner chamber. The housing 1 may be in any shape such as cuboid shape, cube shape and cylinder shape. The positional relationship among the inner chamber 2, the liquid working medium accommodating area 3, the heat exchanger 4 and the delivery passage 5 arranged in the housing 1 may be disposed according to requirements in practice.

In some alternative implementations of the embodiment, the housing 1 comprises a side wall, a bottom and a top, wherein the liquid working medium accommodating area 3 is arranged between the bottom and the inner chamber 2; the heat exchanger 4 is arranged between the inner chamber 2 and the top; and the delivery passage 5 is arranged between the inner chamber 2 and the side wall.

In the embodiment, the inner chamber 2 is in a vacuum state and used for accommodating electronic devices 6 to be cooled.

Here, the inner chamber 2 is set to be a vacuum state. The vacuum means a space having a rare gas with the pressure far smaller than 101.325 kPa (i.e., 1 barometric pressure). The electronic devices 6 to be cooled may be any electronic devices which need to be cooled. As an example, the electronic devices 6 to be cooled may be servers, switches, routers and the like.

In the embodiment, the liquid working medium accommodating area 3 is used for accommodating a liquid working medium. After the liquid working medium cools the electronic devices 6 to be cooled, the liquid working medium is converted into a gas working medium to enter the heat exchanger 4.

Here, the liquid working medium accommodating area 3 may be the bottom of the housing 1, that is, the bottom of the housing 1 is used as an area accommodating the liquid working medium. The liquid working medium accommodating area 3 may also be an additional container arranged in the housing and used for receiving the liquid working medium. The liquid working medium refers to a coolant in a liquid state, and correspondingly the gas working medium refers to a coolant in a gas state. The skilled in the art can understand that there exist various coolants and a suitable coolant may be selected as the cooling working medium based on the physical properties of the coolants.

In the embodiment, the heat exchanger 4 is used for liquefying the gas working medium into liquid working medium and guiding the liquid working medium obtained by liquefying the gas working medium into the delivery passage 5.

Here, the heat exchanger 4 exchanges heat with the gas working medium entering the heat exchanger 4. The heat exchanger 4 absorbs heat and the gas working medium releases heat. And, the gas working medium is liquefied into a liquid working medium, and the heat exchanger 4 guides the liquid working medium converted from the gas working medium into the delivery passage 5. It can be understood that the name of the heat exchanger 4 is not intended to limit the technical solution of the present application, and the heat exchanger 4 may also be called as a cooler, a condenser or the like.

In some alternative implementations of this embodiment, the heat exchanger 4 may be a surface heat exchanger. The gas working medium and the coolant of the surface heat exchanger flow respectively in spaces isolated by a wall surface of the surface heat exchanger, and exchange heat through the heat conduction on the wall surface.

Figure 3:
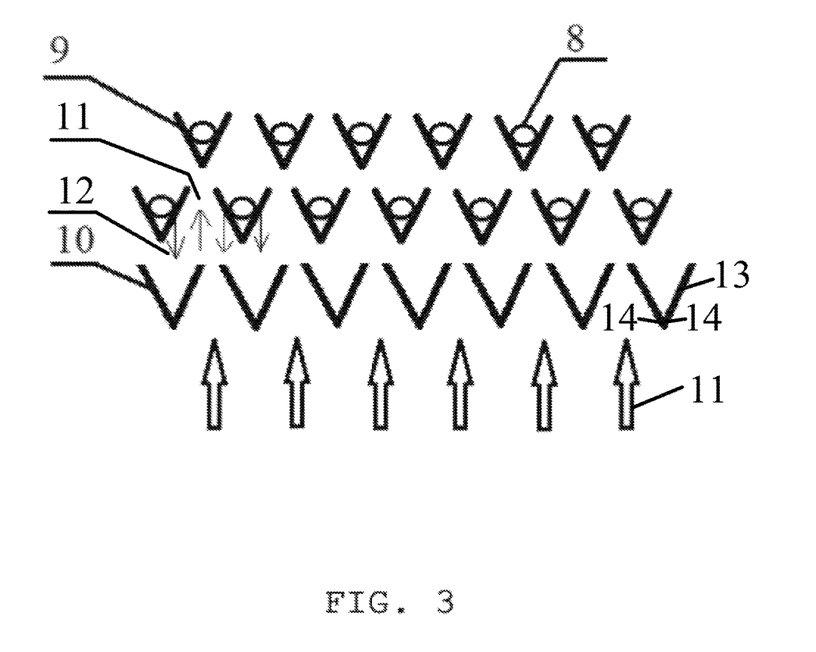
FIG. 3 is a schematic diagram of the machine cabinet according to another embodiment of the present application.

Referring to FIG. 3, an exemplary structure of a heat exchanger according to the present application is illustrated.

In some alternative implementations of this embodiment, the heat exchanger 4 includes heat exchange tubes 8 and cooling fins 9 disposed below the heat exchange tubes 8 and communicated with the delivery passage 5. The heat exchange tubes 8 are used for accommodating the coolant; and the cooling fins 9 are used for liquefying the gas working medium, collecting the liquid working medium obtained by liquefying the gas working medium and guiding the liquid working medium into the delivery passage 5.

Here, the heat exchange tubes 8 are used for accommodating the coolant, which is a low-temperature intermediate medium used for refrigeration by adopting an indirect cooling method and may be called as a cooling medium. Here, the calcium chloride solution, sodium chloride solution, ethylene glycol solution or the like may be used as the coolant. No phase change occurs in the coolant during the heat exchange. The coolant may be filled in or discharged from the heat exchange tubes 8 through orifices of the heat exchange tubes 8, and the orifices of the heat exchange tubes 8 may be arranged outside the housing 1.

Here, the cooling fins 9 may be arranged below the heat exchange tubes 8, and may be in direct or indirect contact with the heat exchange tubes 8 so as to increase the area of indirect contact between the gas working medium and the coolant in the heat exchanger 4 for liquefying the gas working medium. The liquid working medium converted from the gas working medium falls into the cooling fins at a low level, and the cooling fins 9 collect the liquid working medium and guide the collected liquid working medium into the delivery passage 5.

In some alternative implementations of this embodiment, the machine cabinet further comprises guiding fins 10 arranged below the lowest cooling fins and used for collecting the liquid working medium 12 obtained by liquefying with the cooing fins 9 and guiding the liquid working medium 12 into the delivery passage 5.

Here, the guiding fins 10 are arranged below the lowest cooling fins 9, and have no heat exchange tubes 8 provided there above, which correspond to the guiding fins. The lower walls of the guiding fins 10 substantially cannot liquefy the gas working medium 11, and the main function of the guiding fins 10 is to collect the liquid working medium 12 obtained by liquefying the gas working medium 11 with the cooling fins 9 above the guiding fins 10.

In some alternative implementations of this embodiment, the cross sections of the cooling fins 9 and the guiding fins 10 are V-shaped. Here, the cooling fins 9 with the V-shaped cross sections increase the cooling area and simultaneously facilitate the collection of the liquid working medium; and the guiding fins 10 with the V-shaped cross sections facilitate the collection of the liquid working medium.

In some alternative implementations of this embodiment, the upper cooling fins and the lower cooling fins are staggered, and the lowest cooling fins and the guiding fins are staggered. Here, "staggered" means that the tip in the V shape of a upper cooling fin and the tip in the V shape of a lower cooling fin are not in a vertical line, and the tip in the V shape of a lowest cooling fin and the tip in the V shape of a guiding fin are not in a vertical line. With such a heat exchange manner having the staggered flow, the heat exchange efficiency will be high, and the gas working medium and the liquid working medium will be separated with each other quickly, which accelerates the automatic heat circulation.

In some alternative implementations of this embodiment, two ends 14 of a guiding fin 10 are communicated with the delivery passage 5, and two ends 14 of the guiding fin 10 are lower than the middle 13 of the guiding fin 10. With such an arrangement of the guiding fin 10 having two ends lower and the middle, the liquid working medium 12 can enter the delivery passage 5 under the effect of gravity, and no additional power device is needed for the heat exchanger 4.

In this embodiment, the delivery passage 5 is connected with the heat exchanger 4 and the liquid working medium accommodating area 3, and is used for guiding the liquid working medium obtained by liquefying the gas working medium into the liquid working medium accommodating area 3.

Here, the delivery passage 5 can guide the liquid working medium obtained by liquefying the gas working medium into the liquid working medium accommodating area 3. The delivery passage 5 with such a function may be a hollow pipe having a hollow portion through which the liquid working medium passes; may be a capillary tube by which the liquid working medium is guided into the liquid working medium accommodating area; and may be a sidewall of the housing along which the liquid working medium flows into the liquid working medium accommodating area.

In some alternative implementations of this embodiment, the delivery passage 5 may be arranged as a vertical passage which guides the liquid working medium converted from the gas working medium from the heat exchanger 4 on the top of the vertical passage into the liquid working medium accommodating area 3 at the bottom of the passage, under the effect of the gravity.

Figure 4:
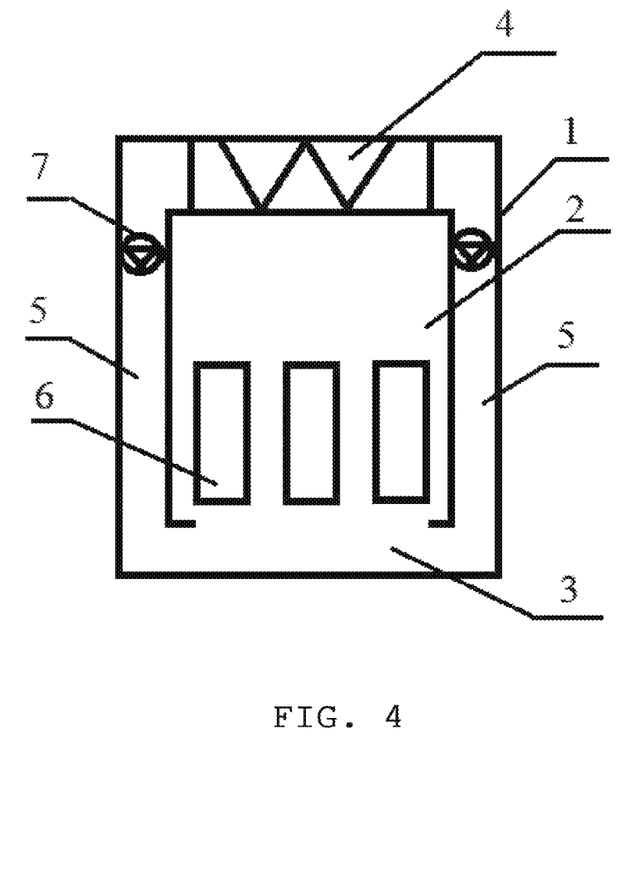
FIG. 4 is a structural schematic diagram of a heat exchanger of the machine cabinet according to the present application.

In some alternative implementations of this embodiment, referring to FIG. 4 illustrating an exemplary structure having a delivery pump arranged in the machine cabinet according to the present application. As shown in FIG. 4, the delivery pump 7 is provided in the delivery passage 5, and used for accelerating the entering of the liquid working medium obtained by liquefying the gas working medium into the liquid working medium accommodating area 3. It can be understood that the delivery pump may be arranged at any position of a circulation passage of the gas working medium or the liquid working medium, for example, in the heat exchanger or at a junction between the heat exchanger and the delivery passage. With the delivery pump as an addition to the gravity circulation, the heat exchange efficiency in the machine cabinet can be increased, so that the height of the machine cabinet can be designed relatively short, which may save the space and reduce the cost.

In some alternative implementations of this embodiment, the machine cabinet may further includes a temperature adjusting device having a coolant adjusting device. The coolant adjusting device is used for adjusting the temperature of the coolant which enters the heat exchanger 4.

Here, the machine cabinet temperature adjusting device may be arranged above the housing 1, and used for adjusting the temperature of the coolant which enters the heat exchanger 4, which may adjust the efficiency of liquefying the gas working medium into the liquid working medium.

In some alternative implementations of this embodiment, the machine cabinet temperature adjusting device may further includes a filling amount adjusting device used for adjusting the filling amount of the liquid working medium filled into the machine cabinet.

Here, by adjusting the filling amount of the liquid working medium, the air pressure in the machine cabinet may be adjusted. Different working mediums in the gas state have respective physical properties, for example, have different saturation temperatures under different pressures. By adjusting the temperature of the coolant in the heat exchanger and the air pressure in the machine cabinet, the temperature of the coolant may match with the tolerable temperature of the electronic devices. If the tolerable temperature of the electronic devices is high, the temperature of the coolant may be relatively high, and the machine cabinet may realize relatively energy-saving heat dissipation.

In some alternative implementations of this embodiment, the machine cabinet temperature adjusting device further includes a sensor arranged in the housing 1. The sensor is used for monitoring parameters in the machine cabinet and sending the parameters to the machine cabinet temperature adjusting device, such that the machine cabinet temperature adjusting device controls and adjusts the temperature of the coolant and the filling amount of the liquid working medium according to the parameters. Here, the sensor includes but not limited to a temperature sensor and a pressure sensor.

In the machine cabinet provided in the present application, the heat released from the electronic devices 6 to be cooled which are placed in the inner chamber 2 increases the temperature of the inner chamber 2. The liquid working medium placed in the liquid working medium accommodating area 3 absorbs the heat to be converted into the gas working medium. The gas working medium converted from the liquid working medium ascends to the heat exchanger 4, releases heat in the heat exchanger 4, and is converted into the liquid working medium. The liquid working medium converted from the gas working medium is guided by using the heat exchanger 4 into the delivery passage 5, and the delivery passage 5 guides the liquid working medium converted from the gas working medium into the liquid working medium accommodating area 3 so as to accomplish a heat exchange cycle.

In the entire cycle, no power device is needed, and the electronic devices in the machine cabinet are in an very quiet working environment. The machine cabinet provided in the present application is according to a two-phase flow heat exchange principle, utilizes the gravity to complete the heat cycle, realizes a heat dissipating manner with cooling by only the liquid in the machine cabinet, improves the factors such as humidity and cleanness influencing the electronic devices, lengthens the service life of the electronic devices, and reduces the workload of operation and maintenance. Further, the machine cabinet of the present application may effectively improve the reliability of the electronic devices in their service life, reduce the workload of operation and maintenance, release the burden of monitoring the electronic devices, and reduce the cost for establishing, operating and maintaining the device cluster.

The foregoing is only a description of the preferred embodiments of the present application and the applied technical principles. It should be appreciated by those skilled in the art that the inventive scope of the present application is not limited to the technical solutions formed by the particular combinations of the above technical features. The inventive scope should also cover other technical solutions formed by any combinations of the above technical features or equivalent features thereof without departing from the concept of the invention, such as, technical solutions formed by replacing the features as disclosed in the present application with (but not limited to), technical features with similar functions.

What is claimed is:
1. A machine cabinet for dissipating heat, comprising:
a housing; and
an inner chamber, a liquid working medium accommodating area, a heat exchanger, guiding fins, and a delivery passage disposed in the housing;
the inner chamber configured to be in a vacuum state and to accommodate to-be-cooled electronic devices;
the liquid working medium accommodating area configured to accommodate a liquid working medium, the liquid working medium converted into a gas working medium to enter the heat exchanger after cooling the to-be-cooled electronic devices;
the heat exchanger configured to liquefy the gas working medium into the liquid working medium and guide the liquid working medium obtained by liquefying the gas working medium into the delivery passage, the heat exchanger including heat exchange tubes and cooling fins arranged below the heat exchange tubes, the guiding fins arranged below lowest cooling fins and configured to collect the liquid working medium obtained by liquefying the gas working medium with the cooling fins and guide the liquid working medium into the delivery passage; and
the delivery passage connected to the heat exchanger and the liquid working medium accommodating area and configured to guide the liquid working medium obtained by liquefying the gas working medium into the liquid working medium accommodating area.

2. The machine cabinet according to claim 1, wherein
the housing comprises a side wall, a bottom and a top;
the liquid working medium accommodating area is located between the bottom and the inner chamber;
the heat exchanger is located between the inner chamber and the top; and
the delivery passage is located between the inner chamber and the side wall.

3. The machine cabinet according to claim 2, wherein a delivery pump is installed in the delivery passage, and configured to accelerate guiding of the liquid working medium obtained by liquefying the gas working medium to enter the liquid working medium accommodating area.

4. The machine cabinet according to claim 1, wherein the cooling fins arranged below the heat exchange tubes are communicated with the delivery passage,
the heat exchange tubes are configured to accommodate a coolant; and
the cooling fins are configured to liquefy the gas working medium, collect the liquid working medium obtained by liquefying the gas working medium, and guide the liquid working medium into the delivery passage.

5. The machine cabinet according to claim 1, wherein cross sections of the cooling fins and the guiding fins are V-shaped.

6. The machine cabinet according to claim 5, wherein two ends of each guiding fin are communicated with the delivery passage, and the two ends of each guiding fin are lower than a middle of the guiding fin.

* * * * *